United States Patent [19]

Shibata

[11] Patent Number: 5,798,721
[45] Date of Patent: Aug. 25, 1998

[54] METHOD AND APPARATUS FOR COMPRESSING TEXT DATA

[75] Inventor: Tetsuya Shibata, Osaka, Japan

[73] Assignee: Mita Industrial Co., Ltd., Osaka-fu, Japan

[21] Appl. No.: 880,571

[22] Filed: Jun. 23, 1997

Related U.S. Application Data

[63] Continuation of Ser. No. 400,903, Mar. 8, 1995, abandoned.

[30] Foreign Application Priority Data

Mar. 14, 1994 [JP] Japan .................................. 6-042380

[51] Int. Cl.$^6$ .................................................. H04N 1/028
[52] U.S. Cl. .......................... 341/106; 341/50; 341/95
[58] Field of Search ........................ 341/50, 55, 87, 341/63, 65, 67, 95, 106

[56] References Cited

U.S. PATENT DOCUMENTS

| | | | |
|---|---|---|---|
| 4,843,389 | 6/1989 | Lisle et al. | 341/106 |
| 4,899,148 | 2/1990 | Sato et al. | 341/65 |
| 5,177,480 | 1/1993 | Clark | 341/51 |

*Primary Examiner*—Marc S. Hoff
*Assistant Examiner*—Peguy JeanPierre
*Attorney, Agent, or Firm*—Jordan and Hamburg

[57] ABSTRACT

An apparatus for compressing text data generated in advance uses character data defined in a code table. The apparatus includes a word extractor which extracts words to be coded from the words in the text data; a code allotter which allots a code to each extracted word that is defined in the code table and different from the codes allotted for the character data; a dictionary generator which generates a dictionary for defining a correspondence between the extracted words and the respective codes allotted to the extracted words; a code replacer which replaces the extracted words with their respective allotted codes to compress the text data; and a storage device which stores the generated dictionary and the compressed text data. The data amount for each text is reduced to improve the storage efficiency of a memory.

14 Claims, 4 Drawing Sheets

FIG. 3

| INPUT TEXT | TEXT DATA |
|---|---|
| LINE TYPE | 0xFB, 0x01, 0x02, '0' |
| SET LINE TYPE | 0xFB, 'S', 'E', 'T', 0x01, 0x02, '0' |

FIG. 4

| DISPLAY TEXT | TEXT DATA |
|---|---|
| LINE TYPE | 'L', 'I', 'N', 'E', '□', 'T', 'Y', 'P', 'E', '0' |
| SET LINE TYPE | 'S', 'E', 'T', '□', 'L', 'I', 'N', 'E', '□', 'T', 'Y', 'P', 'E', '0' |

PRIOR ART

FIG. 5

METHOD AND APPARATUS FOR COMPRESSING TEXT DATA

This application is a continuation of application Ser. No. 08/400,903 filed Mar. 8, 1995 now abandoned.

BACKGROUND OF THE INVENTION

This invention relates to a method and an apparatus for compressing text data such as comments and messages generated in advance to be displayed in a liquid crystal display or like display device and storing the same.

A display art is known which is used in office equipment including facsimile machines and copiers and a variety of industrial apparatuses. Specifically, text data such as a variety of operation methods and comments are generated in advance, and suitable text data is selected according to an operational state of the equipment or a key operation by an operator and is displayed on a display.

In the above display art, when the office equipment such as facsimile machines and copiers are manufactured, texts prepared in advance are converted into text data in the form of coded characters, numbers and other symbols character by character. These text data are stored in an internal memory built in the office equipment main body together with a code table used to convert the text data into code data.

When displaying the text data, text data to be displayed is read from the internal memory and each character of this text data is converted into code data (data consisting of 7 or 8 bits) using the code table. Thereafter, the text data is displayed using a technique for driving a display device such as a liquid crystal device in accordance with the code data.

FIG. 4 is a diagram showing an example of conventional text data stored in the internal memory.

In FIG. 4, "Display Text" refers to a text displayed in the liquid crystal display. As examples of the texts, there are listed "LINE TYPE" and "SET LINE TYPE". "Text Data" are a data construction of the display data stored in the internal memory. For example, the text data is made of a sequence of characters, numbers and other symbols (hereinafter referred to as character data) allotted as the respective code data of the JIS code tables. The respective character data are delimited by ".". The respective words and the respective texts are delimited by a blank data ("☐" in FIG. 4) and by an end data ("0" in FIG. 4) indicative of the end of the text, respectively.

In a display control of the display text, the text data to be displayed is read from the internal memory and each character data thereof is converted into code data using, for example, the JIS code table. Thereafter, the text is displayed by driving the liquid crystal display in accordance with the code data. For example, in the case where the text "LINE TYPE" is to be displayed, the character data of 'L', 'I', . . . 'E' are read one after another from the internal memory and are converted into the code data ('L'="00111100", 'I'= "10011100", etc.). The text "LINE TYPE" is displayed by controlling the driving of display segments provided in the liquid crystal display in accordance with these code data.

In the prior art, the text data of the display text is generated by converting the respective characters composing the display text into the character data and is stored in the internal memory. Accordingly, the text data contains a large amount of data and a share of the text data in a storage area of the internal memory becomes large, thereby making it difficult to effectively use the internal memory. Particularly if the word consisting of many characters is repeatedly used in the display text, the display text consists of many characters even if it consists of few words. Thus, the amount of the text data is large.

In the office equipment exported to many countries, the character data used for the display texts and the code table for converting the character data into the code data are often made common in order to avoid the problem of providing the display texts in languages spoken in the respective export countries. In this case, there are normally required dictionaries of ten and several languages, thereby vastly increasing the data amount of the code table and hindering the effective use of the internal memory.

Further, the conventional display method for converting the display text into the code data character by character requires a long time to retrieve the code table, i.e., to convert the respective character data into the code data. This disadvantageously delays a display response by the liquid crystal display or like display device.

SUMMARY OF THE INVENTION

It is an object of the present invention to provide a method and apparatus for compressing text data which have overcome the problems residing in the prior art.

It is another object of the present invention to provide a method and apparatus for compressing text data which enable the effective use of a memory by decreasing the amount of the text data as much as possible and realize an improved display response.

The present invention is directed to a method for compressing text data generated in advance using character data defined in a code table, comprising the steps of: extracting words to be coded from the words in the text data; allotting a code to each extracted word that is defined in the code table and different from the codes allotted for the character data; generating a dictionary for defining a correspondence between the extracted words and the respective codes allotted to the extracted words; and replacing the extracted words with their respective allotted codes to compress the text data.

Also, the present invention is directed to an apparatus for compressing text data generated in advance using character data defined in a code table, comprising: a word extractor which extracts words to be coded from the words in the text data; a code allotter which allots a code to each extracted word that is defined in the code table and different from the codes allotted for the character data; a dictionary generator which generates a dictionary for defining a correspondence between the extracted words and the respective codes allotted to the extracted words; a code replacer which replaces the extracted words with their respective allotted codes to compress the text data; and a storage device which stores the generated dictionary and the compressed text data.

It may be appreciated to calculate the number of the words to be coded, and place the calculated word number on a head of the compressed text data.

It may be preferable that the character data include a function character, and the codes allotted to the extracted words includes a code allotted to the function character.

Further, it may be appreciated to extract words which have different character sequences; count the recurrence number of each extracted word in the text data; calculate, based on the counted recurrence number, the first total number of bit units for each extracted word in the text data when the extracted word is coded character by character; calculate, based on the counted recurrence number, the second total number of bit units for each extracted word in the text data when the extracted word is coded word by word; and extract words whose second total bit unit number is smaller than its first total bit unit number.

The first total bit unit number may be obtained by multiplying the number of bit units composing the extracted word by the recurrence number of the extracted word. The second total bit unit number may be obtained by adding the bit unit number of the extracted word to a product of the recurrence number of the extracted word in the text data and the bit unit number of the code allotted to the extracted word.

As described above, according to the invention, the data is compressed by extracting words from text data generated in advance using character data defined in a specified code table, and replacing the extracted words with codes not allotted to the characters composing words. Accordingly, the data amount of the text can be reduced compared to text data coded character by character. Thus, the capacity ratio of the text data in a storage device can be reduced, thereby improving the use efficiency of the storage device.

Further, when displaying the text data in a display device or the like, the extracted words are converted in the code data word by word at one time in accordance with the dictionary defining the correspondence between the extracted words and the codes. Therefore, the text data can rapidly be converted into the code data, thereby improving a display response.

Further, the number of the extracted words is placed on the head of the compressed text data. This will facilitate confirmation of the conversion completeness of the extracted words into the code data, and simplify the conversion of the text data into the code data.

Moreover, for each extracted word, the calculation is executed for calculating the first total bit unit number of the word in the text data when the word is coded character by character and the second total bit unit number of the word in the text data when the word is coded word by word. Words whose second total bit unit number is smaller than its first total bit unit number are extracted as words to be coded, and then replaced with allotted codes. Accordingly, the data compression can be carried out at a higher efficiency.

These and other objects, features and advantages of the present invention will become more apparent upon a reading of the following detailed description and accompanying drawings.

BRIEF DESCRIPTION OF THE DRAWINGS

FIG. 3 is a diagram showing an example of text data compressed by the compressing apparatus;

FIG. 4 is a diagram showing an example of conventional text data; and

FIG. 5 is a diagram showing the JIS code table.

DETAILED DESCRIPTION OF THE PREFERRED EMBODIMENTS OF THE INVENTION

Figure 1:
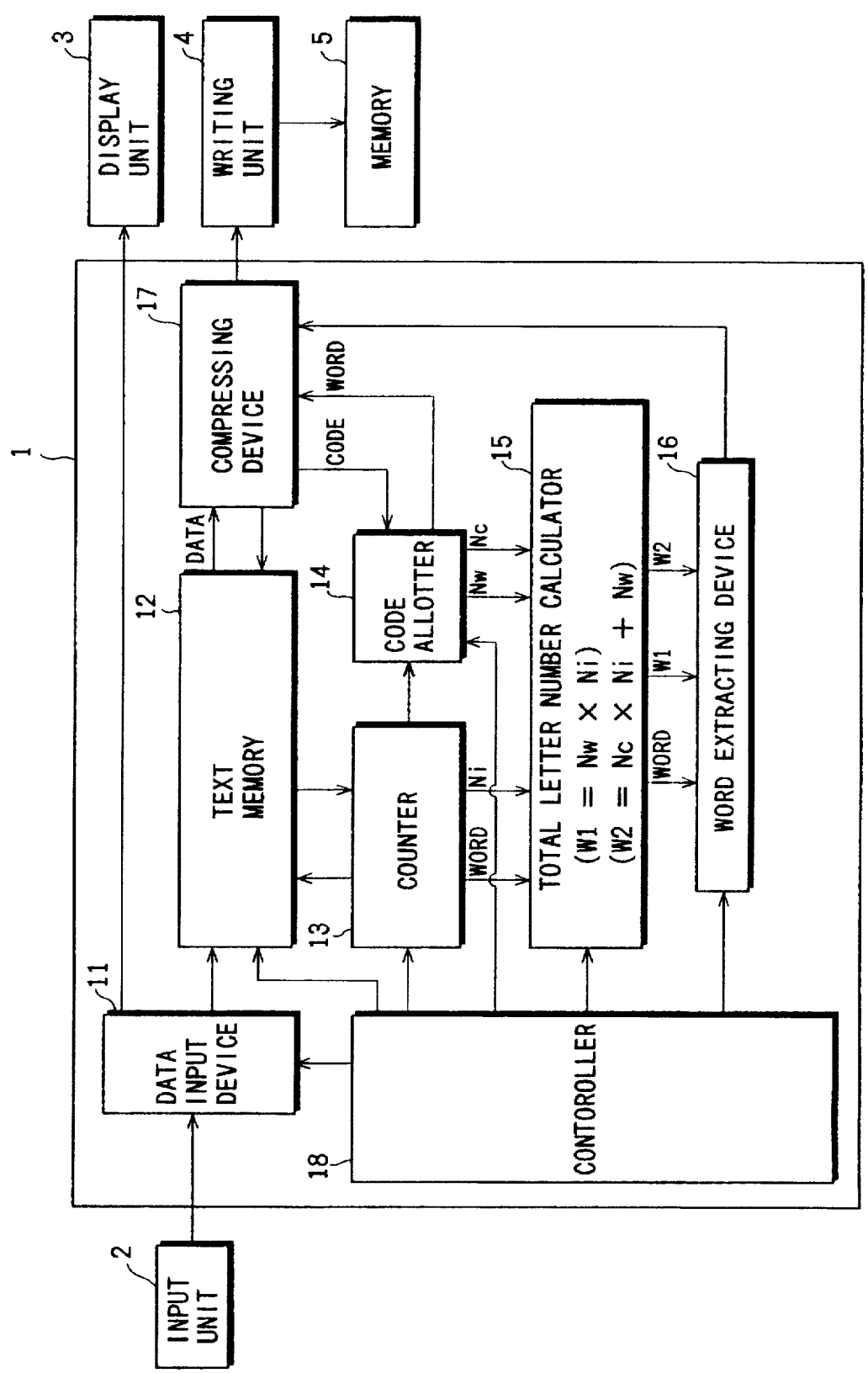
FIG. 1 is a block diagram of a text data compressing apparatus according to the invention.

FIG. 1 is a block construction diagram of a text data compressing apparatus to which text data compressing method according to the invention is applied.

In equipment such as facsimile machines and copiers provided with a liquid crystal display or like display device, normally, text data, such as a variety of operation methods and comments, are generated in advance, and a suitable text data is selected according to an operational state of the equipment or a key operation by an operator and is displayed on a display. The display of the text is made as follows. Character data representing the texts (hereinafter referred to as text data) are written in advance in a memory such as ROM (read only memory) built in the equipment. A specified text data is read from the memory according to the operational state of the equipment and the key operation by the operator. The text is displayed by driving the LCD in accordance with the text data.

The text data compressing apparatus shown in FIG. 1 is adapted to compress the text data prepared by the operator and to write the same in the memory built in the equipment.

The compressing apparatus includes a compressing unit 1, an input unit 2, a display unit 3, and a data writing unit 4. A memory 5 consists of ROM or like memory for storing the text data (compressed data) generated by the compressing apparatus, and is built in the equipment such as a facsimile machine or a copier. The memory 5 is also adapted to store a variety of data and a processing program necessary for an operation control of the equipment in addition to the text data and dictionaries.

The input unit 2 is an operational member with which the operator inputs the text and includes keys, ten numerical keys, and function keys for inputting the characters, numbers and various symbols. The text is input character by character by means of the input unit 2. The correspondence between the code data and the characters, numbers, symbols and functions allotted to the respective keys of the input unit 2 is defined by a specified code table such as a JIS code table and an ASCII code table. The respective characters input by means of the key operation are input to the compressing unit 1 after being converted into the specified code data in accordance with the code table.

The display unit 3 includes a CRT (cathode ray tube), LCD or the like and is adapted to make displays to generate the texts and to perform a compression to be described later. For example, the text input by means of the input unit 2 is displayed in the display unit 3 and the operator is enabled to confirm, correct and delete the input characters while viewing the display.

The compressing unit 1 compresses the text data input by means of the input unit 2 and generates text data to be written in the memory 5. The compressing unit 1 includes a data input device 11, a text memory 12, a recurrence number counter (first extracting means, counting means) 13, a code allotter (allotting means) 14, a total bit unit number calculator (first and second calculating means) 15, a word extracting device (word number counting means, second extracting means) 16, text data compressing device (compressing means, generating means) 17, and a controller 18.

The recurrence number counter 13, total bit unit number calculator 15, and word extracting device 16 constitutes word extracting means for extracting words to be coded word by word from the entire text data.

The data input device 11 is an interface for distributing the text data input by means of the input unit 2 in to the compressing unit 1. The input text data is output to the display unit 3 to be displayed therein and is temporarily stored in the text memory 12.

The text memory 12 stores the text data input by means of the input unit 2 for the data compression. The recurrence number counter 13 extracts individual words (words having different character sequences) included in the input text and counts a number $N_i$ of recurrence of the respective words in the entire text.

The code allotter 14 allots to the extracted words codes in the JIS code table which are not allotted to the characters.

Figure 5:
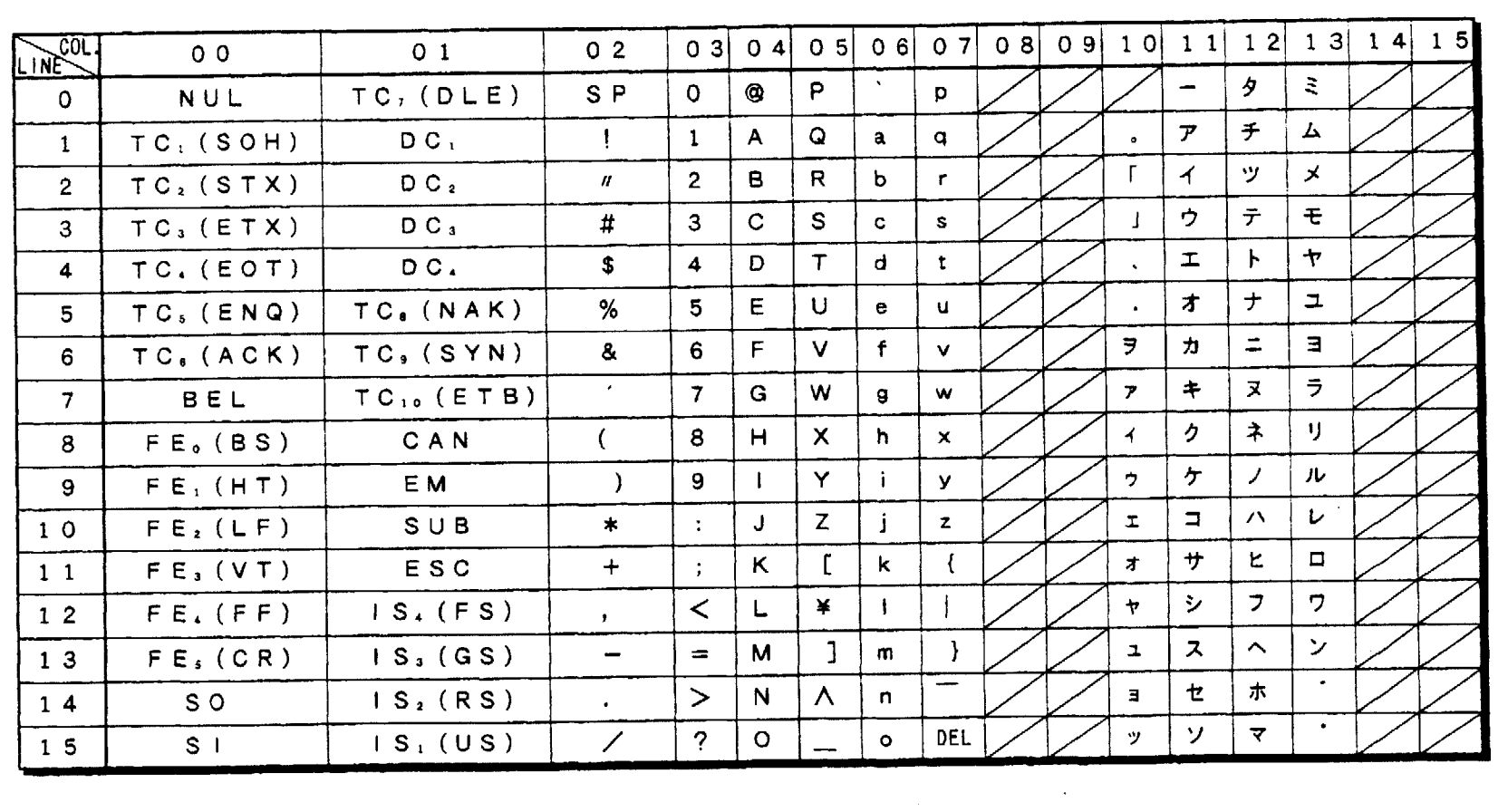

For example, if the characters are defined by the JIS code table shown in FIG. 5, codes in the JIS code table which are not allotted to the characters, e.g., codes allotted to the function characters such as "0(row)×00(column)" to "15 (row) to 00(column)", "0(row)×01(column)" to "15(row) to 00(column)" and undefined codes such as "0(row)×08 (column)" to "15(row) to 08(column)", "0(row)×09 (column)" to "15(row) to 09(column)", are allotted to the extracted words.

The total word calculator 15 calculates, for each of the extracted words, a first total bit unit number W1 (=Ni×Nw) obtained by multiplying a bit unit number (byte number) Nw composing the word and the recurrence number Ni of the word, and a second total number W2 (=Nc×Ni+Nw) obtained by adding the bit unit number Nw to a product (Nc×Ni) of a bit unit number (byte number) Nc of the allotted code by the recurrence number Ni.

The first total bit unit number W1 is a data amount (byte number) required for the word in the text data before the compression, that is, a total bit unit number for the word when the word is coded character by character. On the other hand, the second total bit unit number W2 is a data amount (byte number) required for the word in the text data after the compression (the text data when the text data is compressed while replacing the word with the allotted code), that is, a total bit unit number for the word when the word is coded word by word.

The word extracting device 16 extracts the word(s) to be coded out of the extracted ones. In other words, according to the text data compressing method of the invention, the entire text data is compressed by replacing a part of the words included in the text data word by word with the codes. The word extracting device 16 extracts the words to be coded, i.e., the words to be replaced word by word with the codes.

The word extracting device 16 extracts the words whose second total bit unit number W2 is smaller than its first total bit unit number W1 as those to be coded. This is because the data amount of these words in the text data can be reduced by replacing the words with the allotted codes if the second total bit unit number W2 is smaller than the first total bit unit number W1.

Further, the word extracting device 16 calculates the number of words to be coded for each text data, and places a calculated word number on a head of each text data for text data compression.

The text data compressing device 17 compresses the text data and generates a dictionary defining correspondence between the words extracted to be coded and the allotted codes. The text data compressing device 17 compresses the text data by replacing the words extracted by the word extracting device 16 with the codes allotted thereto, and place data indicative of the number of words to be coded on the head of the text data.

The controller 18 centrally controls the compression of the text data. The controller 18 performs the compression of the text data by controlling the operations of the devices 11 to 17. The data writing unit 4 writes the text data and the dictionary generated by the compressing unit 1.

Figure 2:
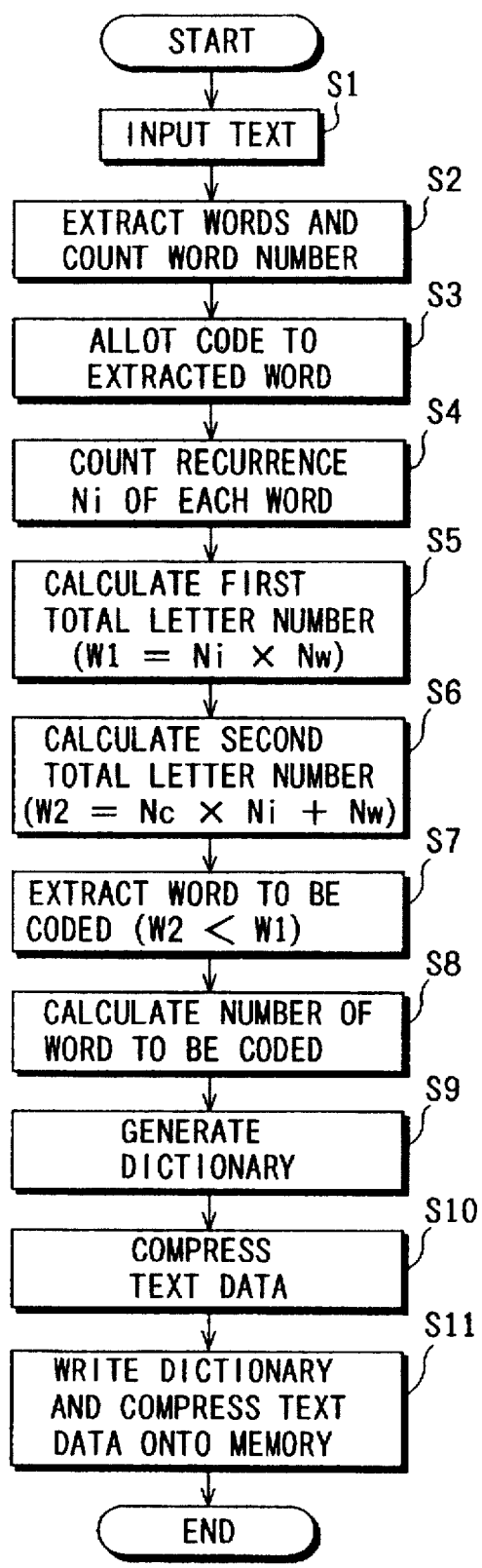
FIG. 2 is a flowchart showing text data compressing operations implemented by the compressing apparatus.

The text data compression performed by the text data compressing apparatus is described with reference to a flowchart shown in FIG. 2.

This embodiment is specifically described using two texts "LINE TYPE" and "SET LINE TYPE" as text data. Let it be assumed that the character data composing the texts are defined by the JIS code table.

After the texts "LINE TYPE" and "SET LINE TYPE" are input by means of the inputting unit 2, these texts are temporarily stored in the text memory 12 in the compressing unit 1 in the format shown in FIG. 4 (Step S1).

Upon completion of the input of the text data, the words included in the text data and having different character sequences, i.e., "LINE", "SET" and "TYPE" are extracted and a number K (=3) of the extracted words is counted by a counter 12 (Step S2). Each word is detected by discriminating the blank data '□' or the end data '0' delimiting the word. Only the words having different character sequences are extracted as a result of comparing the detected words and the already extracted words.

Subsequently, to each of the extracted words, a code different from the code allotted for the character data comprising the word is allotted (Step S3). In other words, the used codes of the JIS code table unused as codes for the character data are allotted to the respective words. For example, codes "0×00", "0×01" and "0×02" allotted as function characters of the JIS code table are allotted to the words "SET", "LINE" and "TYPE", respectively.

Then, the recurrence number Ni of each extracted word in the text data is counted by the recurrence number counter 13 (Step S4). In the above example, the recurrence numbers Ni of the words "LINE", "SET" and "TYPE" are "2", "1" and "2", respectively.

Subsequently, the first total bit unit number W1 (=Ni× Nw) (bytes) of each extracted word is calculated (Step S5). In the above example, the first total bit unit numbers W1 of the words "LINE", "SET" and "TYPE" are "4", "3" and "4", respectively. Thus, the first total bit unit number W1 thereof are "8 (=2×4)", "3 (=1×3)" and "8 (=2×4)", respectively.

Thereafter, the second total bit unit number W1 (=Ni× Nc+Nw) (bytes) of each extracted word is calculated (Step S6). In the above example, since the bit unit numbers Nc (byte) of the codes "0×00", "0×01" and "0×02" are each "1", the first total bit unit number W1 of "LINE", "SET" and "TYPE" are "6 (=1×2+4)", "4 (=1×1+3)" and "6 (=1×2+4)", respectively.

Subsequently, all the words whose second total bit unit number W2 is smaller than its first total bit unit number W1 are extracted as the words to be coded (Step S7). In the above example, the words "LINE" and "TYPE" are extracted because their second total bit unit number W2 is smaller than their first total bit unit number W1.

Further, in Step S8, the number of words to be coded is calculated. For each of the text data "LINE TYPE" and "SET LINE TYPE", the number "2" is calculated.

Then, the dictionary defining the correspondence between the words to be coded and the codes allotted thereto is generated (Step S9) and the text data is compressed (Step S10). The generated dictionary is shown as follows.

| Word | Code |
|------|------|
| LINE | 0 × 01 |
| TYPE | 0 × 02 |

FIG. 3 is a diagram showing an example of text data compressed by the compressing apparatus.

In FIG. 3, the leading data "0×FB" of each text data is data representing the number of words to be coded in the text data. The data "0×FB" represents the number "2", and means that in each of the text data "LINE TYPE" and "SET LINE TYPE", the two words "LINE" and "TYPE" are replaced with the codes (0×01, 0×02).

The data representing the number of the words replaced with the codes is added at the head of each text data in order to facilitate confirmation of conversion completeness of the words to be coded into codes when displaying the entire text data, and simplify the conversion of each text data into code data. More specifically, if the number of words replaced with the codes is known in advance, it is sufficient to convert the text data into the code data word by word using the JIS code table after the number of the words converted word by word into the code data using the dictionary reaches this number in converting the text data into the code data. The processing can be made more rapidly because it is not necessary to convert the text data into the code data properly using the dictionary and the JIS code table. Accordingly, the display response will be improved.

The word "SET" is not replaced with a code and expressed in the character data since its second total bit unit number W2 is larger than its first total bit unit number W1. In the case where the word is replaced with the code, no blank data '□' for discriminating the words is not provided before and after the code.

Upon completing the compression of the text data, the text data and the generated dictionary are written in the memory 5 (Step S11).

In the foregoing embodiment, before extracting words to be coded, all the words are allotted with codes. However, in the case that the bit unit number of a code to be allotted is determined in advance, it may be appreciated to extract words to be coded and then allot the extracted words with codes. In this case, the operation of Step S3 in the flowchart shown in FIG. 2 is placed between Steps S7 and S8 or between Steps S8 and S9.

In the equipment such as a facsimile machine and a copier, the compressed text data are displayed in the LCD or like display device in the following procedure.

For example, when displaying the text "SET LINE TYPE" in the LCD, the text data "0×FB, 'S', 'E', 'T', 0×01, 0×02, '0'" are sequentially read from the memory 5. The respective character data "S", "E" and "T" are converted into the code data "3×5", "5×04", and "4×05" using the JIS code table and are output to the LCD. Further, the codes "0×01" and "0×02" are converted into code data sequence ('L', 'I', 'N', 'E', 'T', 'Y', 'P', 'E') of character data constituting the words "LINE" and "TYPE" using the dictionary stored in the memory 5 and are output to the LCD. The text "SET LINE TYPE" is displayed by controlling the driving of the LCD in accordance with the code data.

As described above, the text data is compressed by replacing, out of the words included in the text data, only the words with the codes allotted thereto. These words are those whose second total bit unit number W2 is smaller than the first total bit unit number W1, i.e., those which contribute to making the number of bit units in the entire text data smaller than when handling all the words in the form of the character data. Accordingly, the amount of the text data can be reduced compared to the text constituted only by the character data. Thus, in the memory 5, a ratio of a capacity for storing the text data to a capacity for storing the other data can be reduced, thereby enabling the effective use of the memory 5.

Here, the above example is more specifically described. If the text data "LINE TYPE" is constituted only by the character data, the bit unit number thereof is "10" as shown in FIG. 4 and the data amount is 10 bytes. If the same text data is constituted by both the character data and the codes, the bit unit number thereof is "4" as shown in FIG. 3. In this way, the data amount can be reduced to 4 bytes.

Likewise, if the text data "SET LINE TYPE" is constituted only by the character data, the data amount thereof is 14 bytes. If the same text data is constituted by both the character data and the codes, the data amount thereof is reduced to 7 bytes. Accordingly, if the text data is constituted by both the character data and the codes, the data amount of the entire text data can be reduced by 13 bytes compared to the case where it is constituted only by the character data.

The case where the text data is constituted by the word number data, character data and the codes necessitates the dictionary for defining the correspondence between the words and the codes in addition to the JIS code table. This dictionary takes up some capacity of the memory 5. However, the increased storage capacity for the dictionary can easily be compensated for by the compression effect of the text data. Thus, despite the need to provide an extra capacity for the dictionary, a capacity ratio of the text data and the dictionary in the memory 5 can be made smaller than the conventional capacity ratio of the text data.

Since the words replaced with the codes are converted into the code data by the word at one time during the displaying operation of the text data, the displaying operation can be performed more rapidly than the prior art which converts the text data into the code data by the words, thereby improving the display response performance.

The text data compressing apparatus may be built in office equipment such as the facsimile device and the copier, so that the equipment main body has a function of compressing the text data. In this case, the operation panel and the display device provided in the equipment main body act as the input unit 2 and the display unit 3, respectively. The equipment main body is constructed such that text data compression mode is settable. When this mode is set, a controller of the equipment main body implements the flowchart shown in FIG. 2 to compress the text data input by means of the input unit 2.

If the equipment main body is provided with the function of compressing the text data, the text data can be changed, added and deleted as a user wishes not only during the manufacturing of the equipment main body, but also after the shipment thereof, thereby improving its operability.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. A method for compressing text data generated in advance using a code table having character codes defining characters and having noncharacter codes not defining characters, comprising the steps of:

processing all of the text data to generate a set of words occurring in the text data with a recurrence number assigned to each of the words indicating a number of times each of the words of the set of words occurs in the text data and with one of the noncharacter codes assigned to each of the words of the set of words, wherein each of the words of the set of words occurs only once in the set of words;

selectively extracting words from the set of words which are representable in the text data using the noncharacter codes in the text data in fewer bytes than using the character codes;

generating a dictionary for defining a correspondence between the selectively extracted words and the noncharacter codes assigned to the selectively extracted words; and replacing the selectively extracted words in the text data with respectively assigned noncharacter codes to produce compressed text data.

2. A method as defined in claim 1, further comprising the step of calculating a word number representing the number of the selectively extracted words, and placing the calculated word number on a head of the compressed text data.

3. A method as defined in claim 1, wherein the noncharacter codes include function character codes, and the noncharacter codes assigned to the selectively extracted words include the function character codes.

4. A method as defined in claim 1, wherein the step of processing all the text data to generate the set of words includes the steps of:

sequentially comparing each word of the text data with each word in the data set, if any, and adding each word to the data set if the word does not already exist in the data set;

counting the recurrence number of each of the words of the set of words in the text data;

calculating a first total number of bit units for each word of the set of words required for representing the respective word in the text data coded character by character using the character codes, the first total number of bit units being calculated based on the recurrence number for the respective word;

calculating a second total number of bit units for each word of the set of words required for representing the respective word in the text data coded word by word using the noncharacter code assigned to the respective word, the second total number of bit units being calculated based on the recurrence number for the respective word; and the selectively extracting words including selecting words from the set of words having a second total number of bit units smaller than a first total number of bit units.

5. A method as defined in claim 4, wherein:

the first total number of bit units of a respective one of the set of words is obtained by multiplying a number of bit units composing the respective one of the set of words represented by the character codes by the recurrence number of the respective one of the set of words; and the second total number of bit units is obtained by adding the number of bit units composing the respective one of the set of words to a product of the recurrence number of the respective one of the set of words and a bit unit number of the noncharacter code assigned to the respective one of the set of words.

6. An apparatus for compressing text data generated in advance using a code table having character codes defining characters and having noncharacter codes not defining characters, comprising:

a text memory for storing the text data;

a counter means for processing all of the text data to generate a set of words occurring in the text data and a recurrence number assigned to each of the words indicating a number of times each of the words of the set of words occurs in the text data, wherein each of the words of the set of words occurs only once in the set of words;

a code allotter for assigning one of the noncharacter codes to each of the words of the set of words;

a word extractor means for selectively extracting words from the set of words which are representable in the text data using the noncharacter codes in the text data in fewer bytes than using the character codes;

a dictionary generator for generating a dictionary for defining a correspondence between the selectively extracted words and the noncharacter codes assigned to the selectively extracted words;

a code replacer which replaces the extracted words with respectively assigned noncharacter codes to produce compressed text data; and a storage device for storing the generated dictionary and the compressed text data.

7. An apparatus as defined in claim 6, further comprising a word number calculator for calculating a word number representing the number of the selectively extracted words, and placing the calculated word number on a head of the compressed text data.

8. An apparatus as defined in claim 6, wherein the noncharacter codes include function character codes, and the noncharacter codes assigned to the selectively extracted words include the function character codes.

9. An apparatus as defined in claim 6, wherein the word extractor means includes;

a first calculator for calculating a first total number of bit units for each word of the set of words required for representing the respective word in the text data coded character by character using the character codes, the first total number of bit units being calculated based on the recurrence number for the respective word;

a second calculator for calculating a second total number of bit units for each word of the set of words required for representing the respective word in the text data coded using the noncharacter code assigned to the respective word, the second total number of bit units being based on the recurrence number for the respective word; and an extracting device for extracting words form the set of words which have a second total number of bit units smaller than a first total number of bit units.

10. An apparatus as defined in claim 9, wherein:

the first calculator calculates the first total number of bit units of a respective one of the set of words by multiplying the number of bit units composing the respective one of the set of words represented by the character codes by the recurrence number of the respective one of the set of words; and the second calculator calculates the second total number of bit units of the respective one of the set of words by adding the number of bit units composing the respective one of the set of words to a product of the recurrence number of the respective one of the set of words and a bit unit number of the noncharacter code assigned to the respective one of the set of words.

11. A method for compressing text data generated using character coding as defined in a code table, the method comprising the steps of:

selecting a first set of words from the text data for word coding and a second set of words for character coding, said second set of words including words of said text data not selected for said first set of words, wherein said first set of words is selected by determining that fewer bits are required to represent said first set of words using word coding than using character coding;

assigning a word code to each word of said first set of words wherein said word code is defined in the code table and does not correspond to a character;

generating a dictionary for defining a correspondence between the word codes and respective ones of said words of said first set of words; and replacing each of said words of said first set of words, throughout said text data, with respective ones of said word codes assigned thereto to effect compression of said text data while maintaining said second set of words using character coding.

12. The method of claim 11 wherein said determining whether fewer bits are required to represent said first set of words using word coding than using character coding includes:

determining a number of occurrences and a number of character code bytes of each said words of said text data;

multiplying the number of occurrences by the number of character code bytes to obtain a character coding number for each of said words;

adding said number of character code bytes for each of said words to a product of said number of occurrences and a number of word code bytes for each word to obtain a word coding number for each of said words; and selecting said first set of words by including therein all words having respective ones of said word coding numbers less than said character coding number.

13. The method of claim 12 wherein said character code for each character is equal in bytes to each of said word codes.

14. A method for compressing text data generated in advance using character data defined in a code table, comprising the steps of:

extracting words to be coded from the words in the text data;

allotting a code to each extracted word that is defined in the code table and different from the codes allotted for the character data;

generating a dictionary for defining a correspondence between the extracted words and the respective codes allotted to the extracted words;

replacing the extracted words with their respective allotted codes to compress the text data; and calculating the number of words to be coded, the calculated word number being placed on a head of the compressed text data.

* * * * *